United States Patent [19]

Dautremont-Smith et al.

[11] Patent Number: 4,595,454
[45] Date of Patent: Jun. 17, 1986

[54] FABRICATION OF GROOVED SEMICONDUCTOR DEVICES

[75] Inventors: William C. Dautremont-Smith, Westfield; Daniel P. Wilt, Scotch Plains, both of N.J.

[73] Assignee: AT&T Bell Laboratories, Murray Hill, N.J.

[21] Appl. No.: 621,080

[22] Filed: Jun. 15, 1984

[51] Int. Cl.[4] .................. H01L 21/306; B44C 1/22; C03C 15/00; C03C 25/06
[52] U.S. Cl. ........................ 156/647; 29/569 L; 156/653; 156/655; 156/659.1; 156/661.1; 156/662; 252/79.2; 357/17; 427/38
[58] Field of Search ............ 156/647, 648, 649, 653, 156/655, 659.1, 661.1, 662; 252/79.2; 29/569 L, 572, 580; 357/16, 17, 30; 430/313, 317; 427/38, 39, 294, 399

[56] References Cited

PUBLICATIONS

"Bilayer Taper Etching of Field Oxides and Passivation Layers", *J. Electrochemical Society*, vol. 127, No. 12, Dec. 1980, pp. 2687-2693, L. K. White.
"Tapered Windows in SiO2, Si3N4, and Polysilicon Layers by Ion Implantation", *J. of Electrochemical Society*, vol. 128, Mar. 1981, pp. 617-619, J. Gotzlich et al.
"V-Grooved Substrate Buried Heterostructure InGaAsP/InP Laser" *Electronics Letters*, vol. 17, No. 13, Jun. 1981, pp. 465-467 H. Ishikawa et al.
"Chemical Etching of InGaAsP/InP DH Wafer", *J. Electrochemical Society*, vol. 129, No. 5, May 1982, pp. 1053-1062, S. Adachi et al.
"Material-Selective Chemical Etching in the System InGaAsP/InP, *J. Electrochemical Society*, vol. 126, No. 2, Feb. 1979, pp. 287-292, S. B. Phatak et al.
"Formation of a Long-Wavelength Buried-Crescent Laser Structure on Channelled Substrates", *IEEE Proc.*, vol. 129, Pt. I, No. 6, Dec. 1982, pp. 209-213, D. L. Murrell et al.

*Primary Examiner*—William A. Powell
*Attorney, Agent, or Firm*—Michael J. Urbano

[57] ABSTRACT

V-grooves are etched in Group III-V compound semiconductors using a composite mask comprising a thin native oxide layer on the semiconductor and a dielectric etch mask on the native oxide. Described in detail is the application of this technique to etching V-grooves in InP for the fabrication of CSBH InP/InGaAsP lasers.

14 Claims, 5 Drawing Figures

FABRICATION OF GROOVED SEMICONDUCTOR DEVICES

CROSS-REFERENCE TO RELATED APPLICATION

This application was concurrently filed with application Ser. No. 621,071 entitled "Semiconductor Devices Employing Fe-Doped MOCVD InP-Based Layer for Current Confinement," W. D. Johnston, Jr., J. A. Long and D. P. Wilt.

BACKGROUND OF THE INVENTION

This invention relates to the manufacture of semiconductor devices and, more particularly, to etch masks and processing for forming grooves in semiconductor material.

Grooves are etched in semiconductor material for a variety of applications. In one case, V-grooves are etched in silicon substrates to form guides for aligning arrays of optical fibers. On the other hand, V-grooves are also etched into Group III-V compound semiconductors in the fabrication of various buried heterostructure (BH) lasers. For example, in one design of the channeled substrate buried heterostructure (CSBH) laser, as shown in FIG. 1, V-groove 24 bifurcates a blocking p-n junction in an InP substrate, and liquid phase epitaxy (LPE) is used to grow a double heterostructure (DH) of InP-InGaAsP-InP layers in the V-groove. The InGaAsP active layer 12 of the CSBH laser has the shape of a crescent, and the cross-sectional area of that layer must be accurately controlled in order to insure, inter alia, fundamental transverse mode, low threshold operation. These desiderata are, in turn, determined by the shape of the V-groove and the position of the active layer therein.

For example, fundamental transverse mode operation up to optical output powers of 10 mW/facet requires the width of the active layer to be $\lesssim 2.5$ μm. To achieve this dimension epitaxial growth in a sharp-bottomed groove is necessary. In addition, the grooves preferably are aligned parallel to the [011] direction on the (100) surface, in order that the side walls of the grooves are (111)B crystallographic planes. The (111)B planes prevent n-InP buffer layer growth on the groove wall, thus eliminating an undesirable leakage current path around the active layer.

The shape of the V-groove is a function of numerous parameters: (1) the particular semiconductor material, (2) the etchant and etching conditions, (3) the crystallographic orientation of the surface being etched, (4) the orientation of the etch mask, (5) the nature of the etch mask material, (6) the extent to which the etchant undercuts the mask, and so forth. Indeed, the groove oftentimes does not have the precise shape of a V at all, which for CSBH lasers renders it exceedingly difficult to control the dimensions of the critical active layer. FIGS. 2–4 illustrate the problem of etching a groove aligned parallel to the [011] direction on the (100) surface of InP. When essentially no undercutting of the etch mask occurs, as shown in FIG. 2, the bottom of the groove has the desired V-shape with oblique (111)B walls, but the top of the groove disadvantageously has vertical (01$\bar{1}$) walls. In contrast, for the same size mask opening w and etching depth D, when excessive undercutting occurs as shown in FIG. 3, the groove has the desired (111)B sidewalls, but the bottom of the groove is flat [a (100) plane] rather than pointed and the groove is much wider. On the other hand, if undercutting is carefully controlled, as shown in FIG. 4, the groove has the proper V-shape with a pointed bottom and only (111)B side walls.

SUMMARY OF THE INVENTION

When etching a groove into Group III-V compound semiconductors, we have found that the extent of undercutting can be controlled by interposing a thin native oxide layer between the etch mask and the semiconductor body to be etched. In addition, we found that V-grooves with (111)B side walls and pointed bottoms can be etched parallel to the [011] direction in (100) surfaces of InP by controlling the undercutting of the etch mask to be approximately one third of the etch depth. The undercutting, in turn, is controlled by the thickness and growth conditions of the native oxide layer.

This process has been successfully employed in the manufacture of CSBH InP/InGaAsP lasers and by virtue of its good reproducibility has increased device yield. It is applicable as well, however, to other semiconductor devices which require the controlled etching of grooves to delineate active regions, current flow paths, and the like.

BRIEF DESCRIPTION OF THE DRAWING

Our invention, together with its various features and advantages, can be readily understood from the following more detailed description taken in conjunction with the accompanying drawing, in which the figures are not drawn to scale in interests of clarity.

DETAILED DESCRIPTION

For pedagogical purposes, our invention will be described initially with reference to the fabrication of CSBH light emitting devices.

CSBH Devices

Figure 1:
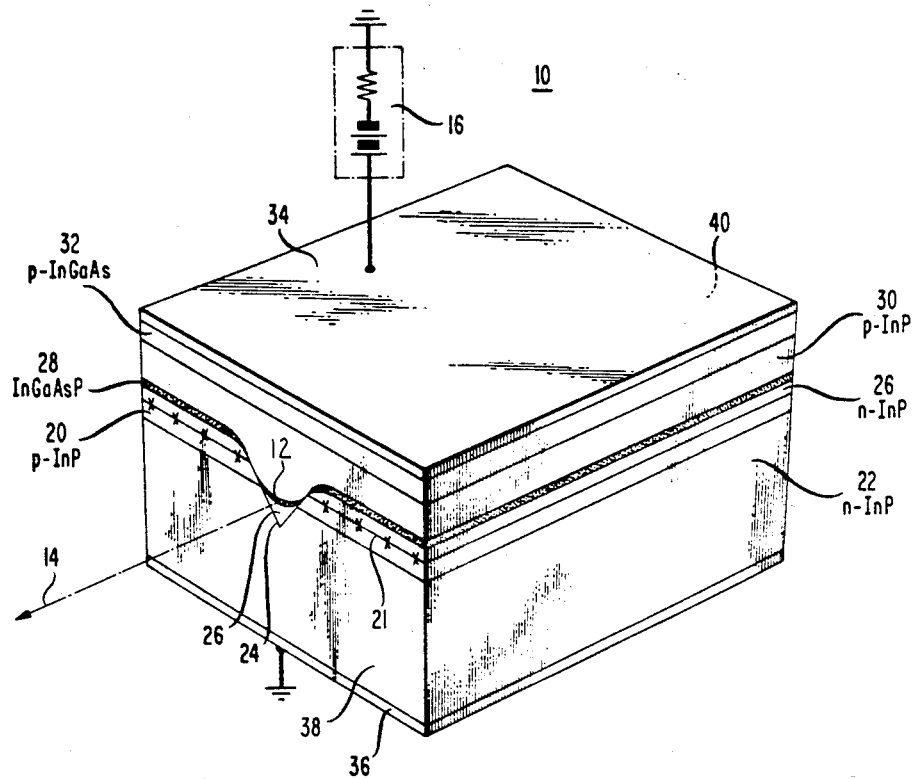
FIG. 1 is a schematic isometric view of a CSBH laser fabricated in accordance with one embodiment of our invention.

Thus, the semiconductor light emitting device shown in FIG. 1 may be used as a laser or as an edge-emitting LED. In either case, the device 10 includes an active region 12 in which the recombination of electrons and holes causes radiation to be emitted at a wavelength characteristic of the bandgap of the semiconductor material of the active region (e.g., about 1.0–1.65 μm for InGaAsP depending on the specific composition of the alloy). The radiation is directed generally along axis 14 and is primarily stimulated emission in the case of a laser and primarily spontaneous emission in the case of an LED.

This recombination radiation is generated by forward-biasing a p-n junction which causes minority carriers to be injected into the active region. Source 16, illustratively depicted as a battery in series with a current-limiting resistor, supplies the forward bias voltage and, in addition, provides pumping current at a level commensurate with the desired optical output power.

In a laser, the pumping current exceeds the lasing current threshold.

In general, the device includes means for constraining the pumping current to flow in a relatively narrow channel through the active region 12. As illustrated, this constraining means comprises a bifurcated, blocking p-n junction 21 (marked with x's for clarity) formed at the interface between n-InP layer 26 and p-InP layer 20. Alternatively, the constraining means may comprise a high resistivity Fe-doped MOCVD InP layer substituted for p-InP layer 20 as described in the concurrently filed application of W. D. Johnston, Jr. et al, supra. In either case, the active region 12 has the shape of a stripe which lies in the rectangular opening of the bifurcated layer 20. Note, in the case of a surface emitting LED the layer 20, rather than being bifurcated, might take the shape of an annulus surrounding a cylindrical or mesa-like active region.

In order to bifurcate layer 20 a groove is etched through that layer into substrate 22.

Figure 5:
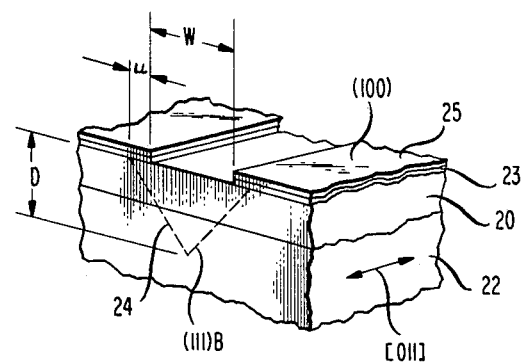
FIG. 5 shows schematically a composite etch mask for etching a V-groove in accordance with one embodiment of our invention.

In accordance with one embodiment of our invention, this etching technique entails the use of a composite etch mask, shown in FIG. 5, comprising a thin (e.g., 20 Å) native oxide layer 23 formed on the top of layer 20, a (100)-oriented InP surface, and a SiO$_2$ layer 25 plasma-deposited onto layer 23. The mask is patterned using standard photolithography and etching so that a plurality of mask openings is formed parallel to that [011] direction, and V-grooves 24 with only (111)B-oriented side walls are formed by subjecting the masked wafer to HCl-rich etchants (only one V-groove 24 is shown for simplicity). Further details of this V-groove forming process are discussed hereinafter.

The following essentially lattice-matched epitaxial layers are then grown by LPE on the etched wafer: an n-InP first cladding layer 26 (the central portion of which fills at least the bottom portion of groove 24); an unintentionally doped InGaAsP layer 28; a p-InP second cladding layer 30; and a p-InGaAs (or p-InGaAsP) contact facilitating layer 32. Layer 28 includes crescent-shaped active region 12 which, in practice, becomes separated from the remainder of layer 28 because epitaxial growth does not take place along the top edges of the groove 24. Preferably, the active layer is vertically positioned within the thickness of layer 20 in order to reduce leakage current.

Electrical contact is made to the device via metal electrodes 34 and 36 on layer 32 and substrate 22, respectively. Source 16 is connected across electrodes 34 and 36.

Although a broad-area contact is depicted by layer 32 and electrode 34, it also is possible to delineate a stripe geometry contact; i.e., the contact-facilitating layer 32 would be etched to form a stripe, and the stripe-shaped opening of a dielectric layer would be positioned within this stripe. A broad area electrode would then be formed over the top of the device. A contact configuration of this type reduces device capacitance and hence increases high speed performance.

The device of FIG. 1, when used as a laser, also includes means for providing optical feedback of the stimulated emission, typically a pair of separated, parallel, cleaved facets 38 and 40 which form an optical cavity resonator. The optical axis of the resonator and the elongated direction of the stripe-shaped active region 12 are generally parallel to one another. Other feedback techniques are also suitable, however, including well-known distributed feedback gratings, for example.

As mentioned previously, as will now describe in some detail the process for etching the V-groove 24 in accordance with our invention.

V-groove Etching

The following examples are provided by way of illustration only. Specific parameters, compositions, materials and the like are not to be construed as limiting the scope of the invention unless otherwise stated.

V-grooves were etched in masked, (100)-oriented InP wafers using freshly prepared HCl:H$_3$PO$_4$ solution at room temperature without agitation. Room temperature is the preferred temperature for forming smooth-walled grooves with this etchant. The etching solution comprised 3 parts by volume of 37% aqueous HCl and 1 part by volume of 85% aqueous H$_3$PO$_4$. Etching was also performed using an HCl:H$_3$PO$_4$ mixture of lower HCl content.

Five types of InP were used: S-doped, n-type ($8 \times 10^{18}$ cm$^{-3}$) liquid encapsulated Czochralski (LEC) substrates; Zn-doped, p-type ($1 \times 10^{18}$ cm$^{-3}$) vapor phase epitaxy (VPE) grown-layers; Fe-doped, semi-insulating, metallo-organic chemical vapor deposited (S.I. MOCVD) layers of the type described by W. D. Johnston, Jr. et al in copending application Ser. No. 604,370, filed on Apr. 26, 1984 and entitled "Semi-Insulating Indium Phosphide Based Compositions"; Fe-implanted, S.I. layers of the type described by R. J. Nelson et al in copending application Ser. No. 549,160 filed on Nov. 7, 1983; and Cd-diffused p-type layers. The latter three were formed in or grown on InP substrates grown by a vertical gradient freeze (VGF) process. VPE layers ($\sim 2$ μm thick) were grown on S-doped LEC substrates in well-known hydride transport reactors under a variety of growth conditions (gas phase supersaturation, diethyl zinc or elemental zinc doping source, and post-growth cool down in an H$_2$ or H$_2$/PH$_3$ ambient). MOCVD layers about 2 μm thick were grown at 700° C. using (Me)$_3$In.P(Me)$_3$ and PH$_3$ as In and P sources, respectively, with ferrocene-based or iron pentacarbonyl-based compounds as the Fe dopant source. Cd diffusions were performed in a well-known leaky boat at 650° C. from a Cd$_3$P$_2$/P$_4$ source to a depth of $\sim 3$ μm.

Etch masks of thickness 1200–3000 Å were deposited by the following processes. After organic solvent cleaning, all wafers were etched in 10:1 H$_2$O:HF by volume, from which they were withdrawn virtually completely de-wetted, verifying native oxide removal. After being blown dry with N$_2$, they were transferred to the oxide growth environment. VPE and MOCVD grown material was, in addition, etched for 1–5 minutes at room temperature in 10:1:1 H$_2$SO$_4$:H$_2$O$_2$:H$_2$O by volume prior to the dilute HF native oxide removal, in order to remove a surface layer which adversely affected mask adhesion during groove etching. Cd-diffused InP was etched for at least 16 minutes in the same 10:1:1 etchant in order to remove a 0.2 μm surface layer containing excess, non-electrically-active Cd, as well as to fine-tune the p-n junction depth to the optimum value to minimize leakage current in the subsequently grown lasers.

After native oxide removal, air exposure time was usually $\leq 6$ minutes, although in one case it was varied from 2 to 15 minutes. One group of wafers was transferred directly to the vacuum chamber of a plasma deposition system, a well-known parallel plate, radial flow reactor. Of these wafers, some received plasma-deposited SiO$_2$ (or SiN$_x$ in some cases) directly, whereas others underwent either plasma-enhanced or purely thermal native oxide growth prior to SiO$_2$ deposition. A second group of wafers underwent native oxide growth externally from the plasma deposition chamber. Growths were performed thermally in air or in high purity O$_2$ or N$_2$O at atmospheric pressure, or wet chemically in warm H$_2$O$_2$. A third group of wafers received RF-sputtered SiO$_2$, which was deposited at 1.1 Wcm$^{-2}$ from a SiO$_2$ target in Ar:O$_2$ sputtering atmospheres of 0, 5.2 and 21% O$_2$ content.

Plasma oxidation at 13.56 MHz of InP wafers resting on a grounded table was performed at 250° C. in pure N$_2$O or in either 2% or 0.51% N$_2$O in Ar at low power density ($\sim$0.05 Wcm$^{-2}$) and for times of the order of a few seconds. Thermal growths within the plasma deposition chamber were carried out at substrate table temperatures up to 395° C. and pressures up to 600 Torr of N$_2$O for times of the order of 10 minutes. Atmospheric pressure thermal growths in air and N$_2$O were at 320° C. to 375° C. in an evacuable tube furnace for times also of the order of 10 minutes. In these cases the thickness of the thermally grown native oxide was self-limiting as a function of temperature. The thickness of the native oxide, grown on a monitor wafer in a dummy growth without subsequent SiO$_2$ deposition, was measured ellipsometrically, assuming a refractive index (at 633 nm) of 1.75. Grown thicknesses in the range 18 to 36 Å were measured in this manner. Rutherford backscattering under channeling conditions has previously shown that under conditions of no intentional native oxide growth the InP/dielectric interface is of submonolayer thickness.

The SiO$_2$ etch mask was photolithographically patterned to open up 2 to 3 $\mu$m wide windows aligned parallel to the [011] crystal direction. Several etchants will produce V-profile grooves in the perpendicular [01$\bar{1}$] direction without need for mask undercut, but these grooves are not suitable for subsequent LPE growth. HCl:H$_3$PO$_4$ etching was performed after photoresist removal, organic solvent cleaning, and a brief etch in 10:1:1 H$_2$SO$_4$:H$_2$O$_2$:H$_2$O by volume. After etching, sections were cleaved perpendicularly to the windows and the channel cross-sections examined in an SEM at ×5K and ×10K magnification with the SiO$_2$ mask in place.

Figure 2:
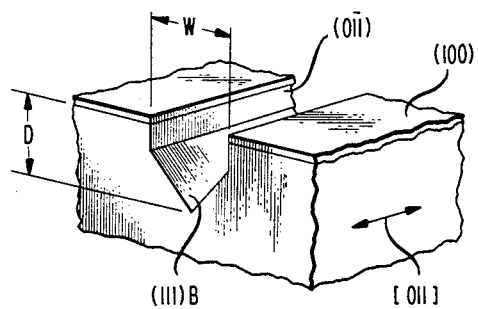
FIGS. 2–4 show schematically various grooves etched in the [011] direction in the (100) surface of a Group III-V compound semiconductor, such as InP, as a function of the extent of mask undercutting.
Figure 4:
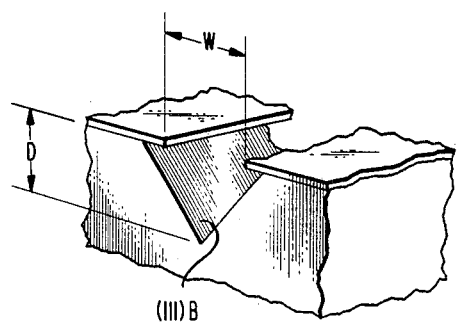

When, however, etching was performed in 1:1 HCl:H$_3$PO$_4$ through the above SiO$_2$ mask (without interfacial native oxide), a profile similar to FIG. 2 was obtained but with a longer vertical wall component. In order to avoid such a vertical wall component, an increased amount of mask undercutting is necessary, corresponding to a larger groove width for a given mask opening. Hence, use of this etchant with reduced concentration of HCl is not desirable.

EXAMPLE 1

Plasma Native Oxide on LEC InP

LEC (100)-oriented InP was etched through a 2.0 $\mu$m wide SiO$_2$ mask opening for 20 sec in 3:1 HCl:H$_3$PO$_4$ by volume.

The preferred profile of FIG. 5 was achieved in accordance with our invention by interposing a native oxide layer 23 about 20 Å±2 Å thick between the mask 25 and the InP. The native oxide was grown by Ar:N$_2$O plasma exposure for about 8 seconds at 250° C. immediately prior to the plasma deposition of the SiO$_2$ mask 25. The extent of mask undercutting was u=1.1 $\mu$m, in conjunction with an etch depth of D=3.0 $\mu$m. The ratio of etch depth to undercut was 2.7. In fact, we have found that to eliminate the vertical wall component of FIG. 2, D/u$\lesssim$3.0. Such a profile has also been obtained with sputtered SiO$_2$ masks deposited in both 5.2% and 21% O$_2$ in Ar sputtering atmospheres. As the substrate was rotated into the plasma beneath the SiO$_2$ target, it was exposed for a few seconds to the oxygen-containing plasma, thus forming a native oxide just before the SiO$_2$ deposition began. However, if no oxygen is used in the sputtering atmosphere, no mask undercutting occurs. Thus, the native oxide layer was again confirmed as being responsible for controlling the amount of undercutting and producing the desired V-groove profile of FIG. 5.

Figure 3:
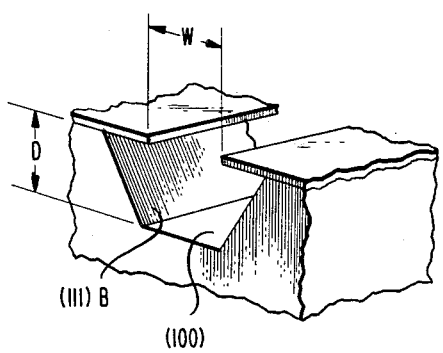

In contrast, profiles of the type shown in FIG. 2 were produced when no native oxide layer was grown, and profiles of the type shown in FIG. 3 were produced when the native oxide layer was too thick (e.g., 34 Å).

We theorize the following explanation of this etching effect based on the different etching rates of the various crystallographic planes of InP: the (100) plane etches rapidly, the (111)B plane etches slowly, and the (01$\bar{1}$) plane essentially does not etch at all. In the absence of the native oxide layer, etching is halted at the (01$\bar{1}$) planes extending down from the mask edges. The effect of the native oxide, which is soluble in the HCl:H$_3$PO$_4$ etchant, is to provide a dynamically increasing mask opening. As a small amount of native oxide dissolves beneath the mask edge, a small amount of the fast-etching (100) plane becomes exposed, and downward etching begins in that region. Continuation of this process produces the observable mask undercutting. The rate of dissolution of the thin native oxide layer, controlled either by its solubility (which is determined by its growth conditions) or by its thickness (which determines the lateral rate of supply of fresh etchant, or removal of etch products, along the interface), determines the rate of exposure of fresh (100) surface. In turn, this rate relative to the etch rate of the (100) plane, and its rate relative to the (111) B plane, determines the final etched profile.

EXAMPLE 2

Plasma Native Oxide on VPE InP

A 3.0 $\mu$m deep V-groove of the type shown in FIG. 5 was etched into VPE (100)-oriented InP through a 2.0 $\mu$m SiO$_2$ mask opening using a 25 sec etch in 3:1 HCl:H$_3$PO$_4$. An undercut of about 1.1 $\mu$m was produced by a plasma-grown native oxide layer about 20 Å thick. Plasma oxidation conditions were 5.0 sec exposure to 0.050 Wcm$^{-2}$ of RF power at 13.56 MHz in 450 mTorr of Ar:0.51% N$_2$O at 250° C.

EXAMPLE 3

Plasma Native Oxide on MOCVD InP

The same 5.0 sec plasma exposure described in Example 2 also produced an appropriate thickness of native oxide layer on S.I. MOCVD (100)-oriented InP and beneath a plasma-deposited SiO$_2$ etch mask. In conjunction with an etch time of 20 sec for a 2.0 $\mu$m mask opening and a 3.0 $\mu$m deep groove, compared to the 25 sec etch time needed for VPE InP, this native oxide layer produced a V-groove of the type shown in FIG. 5.

Note, however, the preferred conditions for this MOCVD material are described in Example 4.

EXAMPLE 4

Thermal Native Oxide on VGF InP

This example utilized Cd-diffused (100)-oriented VGF InP. Prior to the SiO$_2$ deposition thermal oxidation was performed in the SiO$_2$ plasma deposition chamber at 380° C. in about 0.5 atm. of dry N$_2$O for 10 minutes, at which time the native oxide had reached its self-limiting thickness of about 20 Å. Etching in 3:1 HCl:H$_3$PO$_4$ by volume for about 20–25 seconds produced the desired V-groove profile of FIG. 5 for w=2.0 μm and D=3.0 μm.

EXAMPLE 5

Thermal Native Oxide on LEC InP

Using the conditions of Example 4, except that thermal oxidation took place at 395° C., vertical walls about 0.9 μm long, as shown in FIG. 2, were produced on LEC InP. But thermal oxidation in N$_2$O at only 365° C. at 1 atm. produced the desired profile of FIG. 5 when the native oxide growth was performed external to the plasma deposition chamber, entailing a few minutes of atmospheric exposure of the thermally oxidized surface prior to SiO$_2$ deposition. A similar effect has also been obtained by thermal oxidation in air at the further reduced temperature of 320° C., where the presence of H$_2$O enhances the oxidation rate. From these observations, it is conjectured that hydration of the native oxide layer increases its ability to undercut the SiO$_2$ mask. Note, however, the desired V-groove etching of LEC InP can be achieved by forming the native oxide layer either by plasma oxidation (described above) or by thermal oxidation in pure O$_2$ instead of N$_2$O.

EXAMPLE 6

Thermal Native Oxide on VGF InP

In the fabrication of InP/InGaAsP CSBH Lasers of the type shown in FIG. 1, the following process has been employed to etch V-grooves which are 3.0 μm deep and have the profile of FIG. 5.

On a (100)-oriented InP layer 20 formed by Cd diffusion in VGF InP, a ~20 Å thick thermal native oxide layer 23 was grown in a static atmosphere of dry N$_2$O at about 0.5 atm. at 360° C. for 10 minutes. The chamber was actually a parallel plate, radial flow plasma reactor. The thickness of the native oxide layer was self-limiting. Temperatures in the range of 350°–390° C. are suitable, however, depending on other parameters (e.g., the purity of the N$_2$O). After pumping out the chamber, about 1200 Å of SiO$_2$ was plasma-deposited at 360° C. (not critical) in a flow of N$_2$O plus 2% silane in Ar.

The SiO$_2$ layer was patterned using standard photolithography and plasma etching. Then the V-groove was etched in 3:1 HCl:H$_3$PO$_4$ by volume at room temperature for about 25 sec.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although specific examples are given above for etching V-grooves in various kinds of InP, it will be appreciated that the technique is also applicable to other Group III-V semiconductor compounds, especially those which are In-based (e.g., InGaAs, InGaAsP).

What is claimed is:

1. A method of fabricating a device, which includes etching a groove in a surface of a body of a Group III-V compound semiconductor material, comprising the steps of:
    (a) forming a thin native oxide layer on said surface, said oxide layer being soluble in the etchant used to form said groove,
    (b) forming on said oxide layer a dielectric layer which is essentially impervious to said etchant,
    (c) patterning said dielectric layer to form openings therein, and
    (d) exposing said body and said layers to said etchant to form said groove.

2. The method of claim 1 wherein said surface is a (100) crystallographic plane, said openings are elongated and extend parallel to the [011] direction, and said groove has the shape of a V having side walls which are only (111)B crystallographic planes.

3. The method of claim 2 wherein said material includes In and P.

4. The method of claim 3 wherein said etchant comprises a solution of HCl and H$_3$PO$_4$.

5. The method of claim 1, 2, 3 or 4 wherein, in step (a), said native oxide layer is formed by plasma oxidation in an atmosphere of N$_2$O and Ar at an elevated temperature.

6. The method of claim 1, 2, 3 or 4 wherein, in step (a), said native oxide layer is formed by plasma oxidation in an atmosphere of O$_2$ and Ar at an elevated temperature.

7. The method of claim 1, 2, 3 or 4 wherein, in step (a), said native oxide layer is formed by thermal oxidation in an atmosphere of N$_2$O at an elevated temperature.

8. The method of claim 1, 2, 3 or 4 wherein, in step (a), said native oxide layer is formed by thermal oxidation in an atmosphere of O$_2$.

9. The method of claim 1, 2, 3 or 4 wherein, in step (d), said etchant undercuts said dielectric layer by a distance u, said groove is etched to a depth D, and the thickness of said native oxide layer is such that D/u≲3.0.

10. The method of claim 1, 2, 3 or 4 wherein, in step (a), said native oxide layer is grown to a thickness of 20 Å±2 Å.

11. The method of claim 1, 2, 3 or 4 wherein, in step (b), said dielectric layer is formed by plasma deposition of SiO$_2$.

12. A method of fabricating a device, which includes etching a V-groove into a (100)-oriented surface of an InP body, comprising the steps of:
    (a) thermally growing a native oxide layer about 20 Å±2 Å thick on said surface,
    (b) plasma depositing a SiO$_2$ mask on said native oxide layer,
    (c) patterning said mask to form elongated openings which extend parallel to the [011] direction,
    (d) exposing said body and said layers to an etchant comprising a solution of about 3:1 HCl and H$_3$PO$_4$ at essentially room temperature for a time which is effective to undercut said mask by a distance u which is more than about one third the depth of said groove.

13. The method of claim 12 wherein, in step (a), said oxide layer is grown in an atmosphere of dry $N_2O$ at a pressure of about 0.5 atm., a temperature in the range of about 350°–390° C., and for a time of the order of 10 minutes.

14. The method of claim 13 wherein, in step (b), said $SiO_2$ mask is deposited in the same chamber as said native oxide layer to a thickness greater than 1000 Å using $N_2O$ plus a dilute mixture of silane in Ar at a temperature of a few hundred degrees C.

* * * * *